United States Patent
Kang

(10) Patent No.: US 10,312,287 B2
(45) Date of Patent: Jun. 4, 2019

(54) SEMICONDUCTOR APPARATUS

(71) Applicant: SK hynix Inc., Icheon-si, Gyeonggi-do (KR)

(72) Inventor: Jae Seok Kang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/673,043

(22) Filed: Aug. 9, 2017

(65) Prior Publication Data

US 2018/0047785 A1 Feb. 15, 2018

(30) Foreign Application Priority Data

Aug. 10, 2016 (KR) .................. 10-2016-0101937

(51) Int. Cl.
*H01L 27/24* (2006.01)
*H01L 45/00* (2006.01)
*H01L 23/525* (2006.01)

(52) U.S. Cl.
CPC ...... *H01L 27/2436* (2013.01); *H01L 23/5256* (2013.01); *H01L 45/1206* (2013.01)

(58) Field of Classification Search
CPC ............. H01L 23/5256; H01L 27/2436; H01L 45/1206
See application file for complete search history.

(56) References Cited

U.S. PATENT DOCUMENTS

| | | | | |
|---|---|---|---|---|
| 5,330,630 A * | 7/1994 | Klersy | .................... | H01L 45/04 204/192.15 |
| 6,967,344 B2 * | 11/2005 | Ovshinsky | .............. | H01L 45/04 257/2 |
| 7,687,309 B2 * | 3/2010 | Chen | ........................ | H01L 45/06 438/102 |
| 7,772,582 B2 * | 8/2010 | Chen | ....................... | H01L 45/06 257/2 |
| 7,838,341 B2 * | 11/2010 | Dennison | ............ | H01L 27/2409 257/3 |
| 7,839,673 B2 * | 11/2010 | Lowrey | .................... | G11C 5/02 365/113 |
| 7,920,414 B2 * | 4/2011 | Lowrey | .................... | G11C 5/02 365/113 |
| 7,969,769 B2 * | 6/2011 | Lowrey | ............. | H03K 19/1733 326/104 |
| 7,969,770 B2 * | 6/2011 | Chen | ....................... | H01L 28/20 365/148 |

(Continued)

FOREIGN PATENT DOCUMENTS

KR 101056078 B1 8/2011

*Primary Examiner* — Jarrett J Stark
*Assistant Examiner* — Charles N Ausar-El
(74) *Attorney, Agent, or Firm* — William Park & Associates Ltd.

(57) ABSTRACT

A semiconductor apparatus may include a first circuit forming region formed over a substrate, a first interlayer dielectric layer formed over the first circuit forming region, a first metal layer formed over the first interlayer dielectric layer, a second interlayer dielectric layer formed over the first metal layer, and a second circuit forming region formed over the second interlayer dielectric layer. A first circuit and a second circuit that are included in the first circuit forming region and a third circuit that is included in the second circuit forming region may be electrically coupled to each other.

16 Claims, 4 Drawing Sheets

(56) References Cited

U.S. PATENT DOCUMENTS

| | | | | |
|---|---|---|---|---|
| 8,228,719 B2* | 7/2012 | Lowrey | ............... | G11C 5/02 |
| | | | | 365/148 |
| 8,829,590 B2* | 9/2014 | Park | ............... | H01L 45/1206 |
| | | | | 257/319 |
| 9,015,094 B2* | 4/2015 | Suri | ............... | H01L 45/04 |
| | | | | 365/163 |
| 9,153,330 B2* | 10/2015 | Aritome | ............... | G11C 16/14 |
| 9,153,339 B2* | 10/2015 | Chi | ............... | G11C 17/18 |
| 9,159,445 B2* | 10/2015 | Hwang | ............... | G11C 17/18 |
| 9,159,632 B2* | 10/2015 | Lee | ............... | H01L 21/84 |
| 9,165,860 B2* | 10/2015 | Kim | ............... | H01L 23/481 |
| 9,165,899 B2* | 10/2015 | Joh | ............... | H01L 23/49811 |
| 9,406,881 B1* | 8/2016 | Tortorelli | ............... | H01L 45/126 |
| 9,634,246 B2* | 4/2017 | Lee | ............... | H01L 45/08 |
| 9,960,349 B2* | 5/2018 | Chen | ............... | H01L 45/1253 |
| 2004/0178401 A1* | 9/2004 | Ovshinsky | ............... | H01L 45/04 |
| | | | | 257/2 |
| 2004/0178402 A1* | 9/2004 | Ovshinsky | ............... | G11C 13/0004 |
| | | | | 257/2 |
| 2004/0178404 A1* | 9/2004 | Ovshinsky | ............... | G11C 11/56 |
| | | | | 257/4 |
| 2006/0097240 A1* | 5/2006 | Lowrey | ............... | G11C 13/0004 |
| | | | | 257/5 |
| 2007/0194367 A1* | 8/2007 | Moon | ............... | B82Y 10/00 |
| | | | | 257/314 |
| 2012/0155161 A1* | 6/2012 | Lee | ............... | G11C 5/147 |
| | | | | 365/163 |
| 2014/0117304 A1* | 5/2014 | Park | ............... | H01L 27/226 |
| | | | | 257/4 |
| 2015/0003141 A1* | 1/2015 | Son | ............... | G11C 29/846 |
| | | | | 365/96 |
| 2015/0009742 A1* | 1/2015 | Kang | ............... | G11C 17/18 |
| | | | | 365/96 |
| 2018/0026026 A1* | 1/2018 | Hong | ............... | H01L 23/528 |

* cited by examiner

SEMICONDUCTOR APPARATUS

CROSS-REFERENCES TO RELATED APPLICATION

The present application claims priority under 35 U.S.C. § 119(a) to Korean application number 10-2016-0101937, filed on Aug. 10, 2016, in the Korean Intellectual Property Office, which is incorporated herein by reference in its entirety.

BACKGROUND

1. Technical Field

Various embodiments generally relate to a semiconductor integrated circuit, and more particularly, to a semiconductor apparatus.

2. Related Art

Semiconductor apparatuses are being developed to increase the operation speed, reduce the size and power consumption, and increase the capacity.

Development for improving the area efficiency of the semiconductor apparatuses is continuing to achieve a reduction in size, an increase in operation speed, and a reduction in power consumption.

SUMMARY

In an embodiment, a semiconductor apparatus may include: a first circuit forming region formed over a substrate; a first interlayer dielectric layer formed over the first circuit forming region; a first metal layer formed over the first interlayer dielectric layer; a second interlayer dielectric layer formed over the first metal layer; and a second circuit forming region formed over the second interlayer dielectric layer, wherein a first circuit and a second circuit that are included in the first circuit forming region and a third circuit that is included in the second circuit forming region are electrically coupled to each other.

In an embodiment, a semiconductor apparatus may include: a first circuit forming region formed over a substrate; a first interlayer dielectric layer formed over the first circuit forming region; a first metal layer formed over the first interlayer dielectric layer; a second interlayer dielectric layer formed over the first metal layer; and a second circuit forming region formed over the second interlayer dielectric layer, wherein the second circuit forming region includes: a circuit formed of an OTS (Ovonic Threshold Switch) transistor including a second metal layer formed over the second interlayer dielectric layer, an OTS layer formed over the second metal layer, and a third metal layer formed over the OTS layer.

DETAILED DESCRIPTION

Hereinafter, a semiconductor apparatus will be described below with reference to the accompanying drawings through various examples of embodiments.

Figure 1:
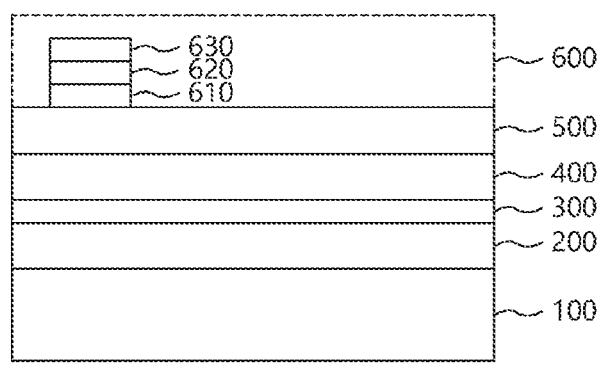
FIG. 1 is a diagram illustrating a semiconductor apparatus in accordance with an embodiment.

As shown in FIG. 1, a semiconductor apparatus in accordance with an embodiment may include a substrate 100, a first circuit forming region 200, a first interlayer dielectric layer 300, a first metal layer 400, a second interlayer dielectric layer 500, and a second circuit forming region 600.

The first circuit forming region 200 may be formed on the substrate 100.

The first interlayer dielectric layer 300 may be formed between the first circuit forming region 200 and the first metal layer 400. The first metal layer 400 may be formed over the first interlayer dielectric layer 300.

The second interlayer dielectric layer 500 may be formed over the first the metal layer 400, and between the second circuit forming region 600 and the first metal layer 400.

The first circuit forming region 200 may be a region in which a peripheral circuit and core circuits of the semiconductor apparatus are formed, and may also be regarded as a region in which Metal-Oxide-Semiconductor (MOS) transistors are formed.

The first metal layer 400 may be electrically coupled with the first circuit forming region 200 through a contact and include signal lines configured to couple MOS transistors formed in the first circuit forming region 200 with each other and supply a power supply voltage to the MOS transistors.

The second circuit forming region 600 may be formed over the second interlayer dielectric layer 500, and may include a second metal layer 610, an OTS (Ovonic Threshold Switch) layer 620, and a third metal layer 630.

The second metal layer 610 may be formed on the second interlayer dielectric layer 500.

The OTS layer 620 may be formed on the second metal layer 610.

The third metal layer 630 may be formed on the OTS layer 620.

Each of the second metal layer 610, the OTS layer 620, and the third metal layer 630 may be electrically coupled with the first metal layer 400 through a contact. Therefore, the first circuit forming region 200 and the second circuit forming region 600 may be electrically coupled with each other.

The second and third metal layers 610 and 630 may function as a drain and a source of a transistor, and the OTS layer 620 may function as a gate of a transistor. Thus, the second circuit forming region 600 may form OTS transistors including a P-type OTS transistor and an N-type OTS transistor. In this regard, if a P-type impurity is added to at least a portion of the OTS layer 620, a P-type OTS transistor may be formed of the second metal layer 610, the OTS layer 620, and the third metal layer 630. Furthermore, if an N-type impurity is added to at least a portion of the OTS layer 620, an N-type OTS transistor may be formed of the second metal layer 610, the OTS layer 620, and the third metal layer 630.

Therefore, a circuit may be embodied in the second circuit forming region 600.

Figure 2:
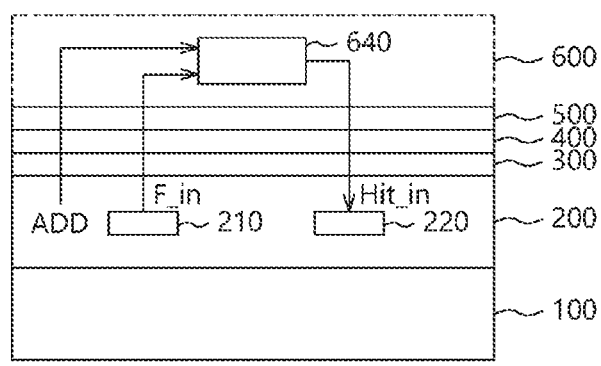
FIG. 2 is a diagram illustrating a semiconductor apparatus in accordance with an embodiment.

For example, the semiconductor apparatus in accordance with an embodiment may be formed in a manner as shown in FIG. 2.

The first circuit forming region 200 may transmit a signal to the second circuit forming region 600 and receive a signal from the second circuit forming region 600.

For example, the first circuit forming region 200 may include a first circuit including a fuse array 210 and a second circuit including a repair circuit 220 provided by MOS transistors. The second circuit forming region 600 may include a third circuit including a comparison circuit 640. Further, the comparison circuit 640 may be electrically coupled with the fuse array 210 and the repair circuit 220.

The first circuit forming region 200 may provide an address ADD and fuse information F_in to the comparison circuit 640 of the second circuit forming region 600. The fuse information F_in may be provided from the fuse array 210.

The comparison circuit 640 of the second circuit forming region 600 may compare whether the address ADD corresponds to the fuse information F_in, and provide a comparison result signal Hit_in to the repair circuit 220 of the first circuit forming region 200.

Figure 3:
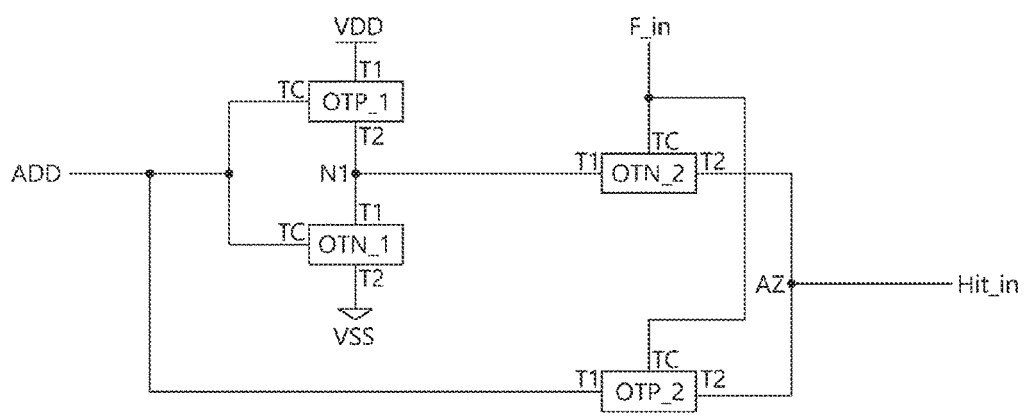
FIG. 3 is a diagram illustrating a configuration of a comparison circuit of FIG. 1.

The comparison circuit 640 as illustrated in FIG. 3 may include first and second P-type OTS transistors OTP_1 and OTP_2, and first and second N-type OTS transistors OTN_1 and OTN_2. The first P-type OTS transistor OTP_1 may include one terminal T1 to which an external voltage VDD is applied, and a control terminal TC to which the address ADD is inputted. The first N-type OTS transistor OTN_1 may have one terminal T1 to which a second terminal T2 of the first P-type OTS transistor OTP_1 is coupled, a control terminal TC to which the address ADD is inputted, and an other terminal T2 to which a ground terminal VSS is coupled. The second N-type OT transistor OTN_2 may have one terminal T1 coupled to a node N1 which is also coupled with the first N-type OTS transistor OTN_1 and the first P-type OTS transistor OTP_1, and a control terminal TC to which the fuse information F_in is inputted. The second P-type OTS transistor OTP_2 may have one terminal T1 to which the address ADD is inputted, and a control terminal TC to which the fuse information F_in is inputted. The comparison result signal Hit_in is outputted from a node N2 to which the other terminal T2 of the second P-type OTS transistor OTP_2 and the other terminal T2 of the second N-type OTS transistor OTN_2 are coupled. The one terminal T1 and the other terminal T2 of each of the first and second P-type OTS transistor OTP_1 and OTP_2 and the first and second N-type OTS transistor OTN_1 and OTN_2 may be the contacts coupled to and corresponding to the second metal layer 610 and the third metal layer 630 shown in FIG. 1. The control terminal TC of each of the first and second P-type OTS transistor OTP_1 and OTP_2 and the first and second N-type OTS transistor OTN_1 and OTN_2 may be the contact coupled to and corresponding to the OTS layer 620.

The operation of the comparison circuit 640 having the above-mentioned configuration is as follows.

Description will now be made for the case where the address ADD is in a high level and the fuse information F_in is in a high level.

The first P-type OTS transistor OTP_1 receives the high-level address ADD and is thus turned off.

The first N-type OTS transistor OTN_1 receives the high-level address ADD and is thus turned on. The turned-on first N-type OTS transistor OTN_1 provides a low-level signal to the second N-type OTS transistor OTN_2.

The second N-type OTS transistor OTN_2 receives the high-level fuse information F_in and is thus turned on.

The second P-type OTS transistor OTP_2 receives the high-level fuse information F_in and is thus turned off.

The turned-on second N-type OTS transistor OTN_2 outputs, as the comparison result signal Hit_in, a low-level signal provided from the first N-type OTS transistor OTN_1. Hence, the comparison result signal Hit_in is outputted as a low-level signal.

Thus, if the level of the address ADD and the level of the fuse information F_in are a same high level, the comparison circuit 640 may output the low-level comparison result signal Hit_in.

Description will now be made for a case where the address ADD is a high level and the fuse information F_in is a low level.

The first P-type OTS transistor OTP_1 receives the high-level address ADD and is thus turned off.

The first N-type OTS transistor OTN_1 receives the high-level address ADD and is thus turned on. The turned-on first N-type OTS transistor OTN_1 provides a low-level signal to the second N-type OTS transistor OTN_2.

The second N-type OTS transistor OTN_2 receives the low-level fuse information F_in and is thus turned off.

The second P-type OTS transistor OTP_2 receives the low-level fuse information F_in and is thus turned on.

The turned-on second P-type OTS transistor OTP_2 outputs, as the comparison result signal Hit_in, the high-level address ADD. Hence, the comparison result signal Hit_in is outputted as a high-level signal.

Thus, if the address ADD is a high level and the fuse information F_in is a low level different from the address ADD, the comparison circuit 640 may output the high-level comparison result signal Hit_in.

Description will now be made for the case where the address ADD is in a low level and the fuse information F_in is in a high level.

The first P-type OTS transistor OTP_1 receives the low-level address ADD and is thus turned on. The turned-on first P-type OTS transistor OTP_1 provides a high-level signal to the second N-type OTS transistor OTN_2.

The first N-type OTS transistor OTN_1 receives the low-level address ADD and is thus turned off.

The second N-type OTS transistor OTN_2 receives the high-level fuse information F_in and is thus turned on.

The second P-type OTS transistor OTP_2 receives the high-level fuse information F_in and is thus turned off.

The turned-on second N-type OTS transistor OTN_2 outputs, as the comparison result signal Hit_in, a high-level signal provided from the first P-type OTS transistor OTP_1. Hence, the comparison result signal Hit_in is outputted as a high-level signal.

Thus, if the address ADD is a low level and the fuse information F_in is a high level different from that of the address ADD, the comparison circuit 640 may output the high-level comparison result signal Hit_in.

Description will now be made for a case where the address ADD is in a low level and the fuse information F_in is in a low level.

The first P-type OTS transistor OTP_1 receives the low-level address ADD and is thus turned on. The turned-on first P-type OTS transistor OTP_1 provides a high-level signal to the second N-type OTS transistor OTN_2.

The first N-type OTS transistor OTN_1 receives the low-level address ADD and is thus turned off.

The second N-type OTS transistor OTN_2 receives the low-level fuse information F_in and is thus turned off.

The second P-type OTS transistor OTP_2 receives the low-level fuse information F_in and is thus turned on.

The turned-on second P-type OTS transistor OTP_2 outputs, as the comparison result signal Hit_in, the low-level address ADD. Hence, the comparison result signal Hit_in is outputted as a low-level signal.

Thus, if the level of the address ADD and the level of the fuse information F_in are a same low level, the comparison circuit 640 may output the low-level comparison result signal Hit_in.

Eventually, if the level of the address ADD and the level of the fuse information F_in are the same as each other, the comparison circuit 640 may output the low-level comparison result signal Hit_in. Furthermore, if the level of the address ADD and the level of the fuse information F_in are different from each other, the comparison circuit 640 may output the high-level comparison result signal Hit_in.

As such, in the semiconductor apparatus according to an embodiment, because a circuit (for example, the comparison circuit 640) that operates (compares) in response to signals, e.g., an address ADD and fuse information F_in, to be transmitted from the first circuit forming region 200 may be configured in the second circuit forming region 600, the area efficiency of the first circuit forming region 200 may be enhanced.

Figure 4:
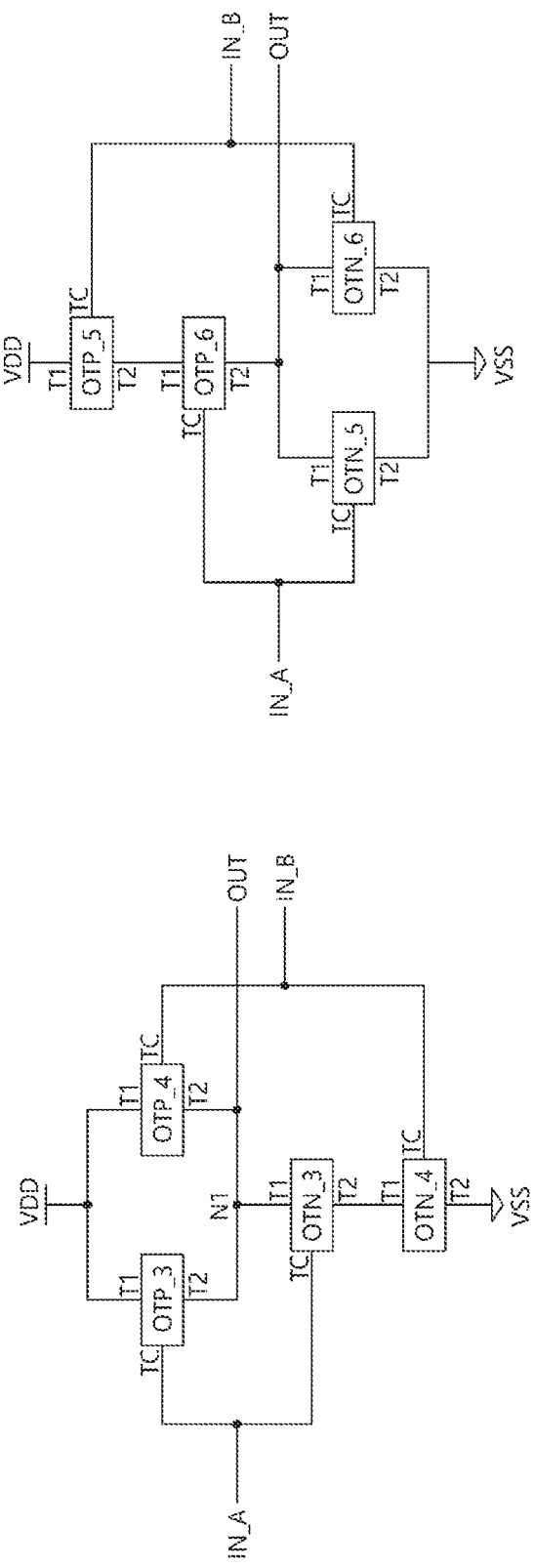
FIGS. 4A and 4B are a diagram illustrating a configuration of a semiconductor apparatus in accordance with an embodiment.

Furthermore, referring to FIGS. 4A and 4B, in the second circuit forming region 600, a NAND gate may be formed, as shown in 4A, and a NOR gate may also be formed, as shown in 4B, so that other circuits as well as the comparison circuit 640 shown in FIGS. 2 and 3 may also be formed.

The NAND gate shown in FIG. 4A may include third and fourth P-type OTS transistors OTP_3 and OTP_4 and third and fourth N-type OTS transistors OTN_3 and OTN_4. The third P-type OTS transistor OTP_3 may include one terminal T1 to which an external voltage VDD is applied, and a control terminal TC to which a first input signal IN_A is inputted. The fourth P-type OTS transistor OTP_4 may include one terminal T1 to which an external voltage VDD is applied, and a control terminal TC to which a second input signal IN_B is inputted. The respective other terminals T2 of the third and fourth P-type OTS transistors OTP_3 and OTP_4 are coupled in common. The third N-type OTS transistor OTN_3 includes one terminal T1 which is coupled to a node N1 to which the other terminals T2 of the third and fourth P-type OTS transistors OTP_3 and OTP4 are coupled, and a control terminal TC to which the first input signal IN_A is inputted. The fourth N-type OTS transistor OTN_4 may have one terminal T1 to which the other terminal T2 of the third N-type OTS transistor OTN_3 is coupled, a control terminal TC to which the second input signal IN_B is inputted, and an other terminal T2 to which the ground terminal VSS is coupled. In this regard, an output signal OUT is outputted from the node N1 to which the third and fourth P-type OTS transistors OTP_3 and OTP_4 and the third N-type OTS transistor OTN_3 are coupled.

The NOR gate shown in FIG. 4B may include fifth and sixth P-type OTS transistors OTP_5 and OTP_6 and fifth and sixth N-type OTS transistors OTN_5 and OTN_6. The fifth P-type OTS transistor OTP_5 may include one terminal T1 to which an external voltage VDD is applied, and a gate TG to which a second input signal IN_B is inputted. The sixth P-type OTS transistor OTN_6 includes one terminal T1 to which the other terminal T2 of the fifth P-type OTS transistor OTP_5 is coupled, and a control terminal TC to which the first input signal IN_A is inputted. The fifth N-type OTS transistor OTN_5 may have one terminal T1 to which the other terminal T2 of the sixth P-type OTS transistor OTP_6 is coupled, a control terminal TC to which the first input signal IN_A is inputted, and the other terminal T2 to which the ground terminal VSS is coupled. The sixth N-type OTS transistor OTN_6 may have one terminal T1 to which the other terminal T2 of the sixth P-type OTS transistor OTP_6 is coupled, a control terminal TC to which the second input signal IN_B is inputted, and the other terminal T2 to which the ground terminal VSS is coupled.

While various embodiments have been described above, it will be understood to those skilled in the art that the embodiments described are examples only. Accordingly, the data storage device and operating method thereof described herein should not be limited based on the described embodiments.

Figure 5:
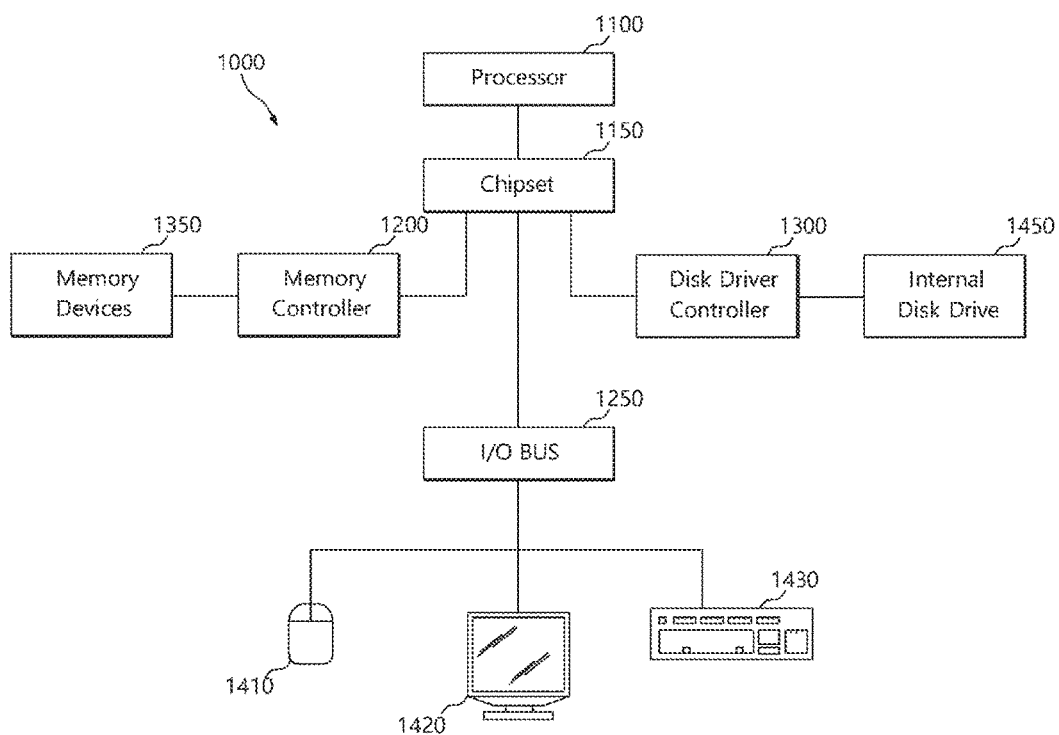
FIG. 5 illustrates a block diagram of a system employing a semiconductor apparatus in accordance with the various embodiments discussed above with relation to FIGS. 1-4B.

The semiconductor apparatus discussed above (see FIGS. 1-4B) are particularly useful in the design of memory devices, processors, and computer systems. For example, referring to FIG. 5, a block diagram of a system employing a semiconductor apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor apparatus as discussed above with reference to FIGS. 1-4B. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus as discussed above with relation to FIGS. 1-4B, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a system 1000 employing a semiconductor device as discussed above with relation to FIGS. 1-4B. In alternate embodiments, such as, for example but not limited to, cellular phones or digital cameras, the components may differ from the embodiments illustrated in FIG. 5.

What is claimed is:

1. A semiconductor apparatus comprising:
a first circuit forming region formed over a substrate;
a first interlayer dielectric layer formed over the first circuit forming region;
a first metal layer formed over the first interlayer dielectric layer;
a second interlayer dielectric layer formed over the first metal layer; and
a second circuit forming region formed over the second interlayer dielectric layer,
wherein a first circuit and a second circuit that are included in the first circuit forming region and a third circuit that is included in the second circuit forming region are electrically coupled to each other,
wherein at least one MOS (Metal-Oxide-Semiconductor) transistor is formed in the first circuit forming region,
wherein the first circuit forming region includes the first and second circuits provided by the at least one MOS transistor, and
wherein the second circuit forming region comprises:
a second metal layer formed over the second interlayer dielectric layer;
an OTS (Ovonic Threshold Switch) layer formed over the second metal layer;
wherein the third circuit comprises an OTS transistor including a third metal layer formed over the OTS layer,
wherein the first circuit includes a fuse array,
wherein the second circuit includes a repair circuit, and
wherein the third circuit includes a comparison circuit.

2. The semiconductor apparatus of claim 1,
wherein the fuse array provides fuse information to the comparison circuit, and
wherein the comparison circuit compares the fuse information and the address and provides a comparison result signal to the repair circuit.

3. The semiconductor apparatus of claim 2, wherein if a level of the fuse information and address are the same the comparison circuit provides a first comparison result signal to the repair circuit.

4. The semiconductor apparatus of claim 3, wherein if the fuse information has a first level and the address has the first level the comparison circuit provides the first comparison result signal to the repair circuit.

5. The semiconductor apparatus of claim 3, wherein if the fuse information has a second level and the address has the second level the comparison circuit provides the first comparison result signal to the repair circuit.

6. The semiconductor apparatus of claim 2, wherein if a level of the fuse information and address are not the same the comparison circuit provides a second comparison result signal to the repair circuit.

7. The semiconductor apparatus of claim 6, wherein if the fuse information has a first level and the address has a second level the comparison circuit provides the second comparison result to the repair circuit.

8. The semiconductor apparatus of claim 6, wherein if the fuse information has a second level and the address has a first level the comparison circuit provides the second comparison result to the repair circuit.

9. The semiconductor apparatus of claim 1, wherein the second metal layer and the third metal layer function as a drain and a source of the OTS transistor, and the OTS layer functions as a gate of the OTS transistor.

10. A semiconductor apparatus comprising:
a first circuit forming region formed over a substrate;
a first interlayer dielectric layer formed over the first circuit forming region;
a first metal layer formed over the first interlayer dielectric layer;
a second interlayer dielectric layer formed over the first metal layer; and
a second circuit forming region formed over the second interlayer dielectric layer,
a comparison circuit configured to provide a comparison result signal to the first circuit forming region in response to an address and fuse information inputted from the first circuit forming region,
wherein the second circuit forming region comprises:
a circuit formed of an OTS (Ovonic Threshold Switch) transistor including a second metal layer formed over the second interlayer dielectric layer, an OTS layer formed over the second metal layer, and a third metal layer formed over the OTS layer.

11. The semiconductor apparatus of claim 10,
wherein the OTS transistor includes a P-type OTS transistor and an N-type OTS transistor, and
wherein the comparison circuit comprises:
a first P-type OTS transistor including a control terminal to which the address is inputted, and one terminal to which an external voltage is applied;
a first N-type OTS transistor including a control terminal to which the address is inputted, one terminal to which an other terminal of the first P-type OTS transistor is coupled, and an other terminal to which a ground terminal is coupled;
a second N-type OTS transistor including a control terminal to which the fuse information is inputted, one terminal coupled to a node which is coupled with the first P-type OTS transistor and the first N-type OTS transistor, and an other terminal from which the comparison result signal is outputted; and
a second P-type OTS transistor including a control terminal to which the fuse information is inputted, one terminal to which the address is inputted, and an other terminal from which the comparison result signal is outputted.

12. The semiconductor apparatus of claim 11, wherein the one terminal and the other terminal of each of the first and second P-type OTS transistors and the first and second N-type OTS transistors correspond to the second metal layer and the third metal layer, and the control terminal thereof corresponds to the OTS layer.

13. The semiconductor apparatus of claim 11, wherein:
the first N-type OTS transistor is configured to be turned on upon receiving the address of a first level, and the turned-on first N-type OTS transistor is configured to provide a signal of a second level to the second N-type OTS transistor; and
the second N-type OTS transistor is configured to be turned on upon receiving the fuse information of the first level, and the turned-on second N-type OTS transistor is configured to output the comparison result signal having the second level upon receiving the signal of the second level.

14. The semiconductor apparatus of claim 11, wherein:
the first N-type OTS transistor is configured to be turned on upon receiving the address of a first level, and the turned-on first N-type OTS transistor is configured to provide a signal of a second level to the second N-type OTS transistor; and
the second P-type OTS transistor is configured to be turned on upon receiving the fuse information of the second level, and the turned-on second P-type OTS transistor is configured to output the comparison result signal having the first level upon receiving the address of the first level.

15. The semiconductor apparatus of claim 11, wherein:
the first P-type OTS transistor is configured to be turned on upon receiving the address of a second level, and the turned-on first P-type OTS transistor is configured to provide a signal of a first level to the second N-type OTS transistor; and
the second N-type OTS transistor is configured to be turned on upon receiving the fuse information of the first level, and the turned-on second N-type OTS transistor is configured to output the comparison result having the first level upon receiving the signal of the first level.

16. The semiconductor apparatus of claim 11, wherein:
the first P-type OTS transistor is configured to be turned on upon receiving the address of a second level, and the turned-on first P-type OTS transistor is configured to provide a signal of a first level to the second N-type OTS transistor; and
the second P-type OTS transistor is configured to be turned on upon receiving the fuse information of the second level, and the turned-on second P-type OTS transistor is configured to output the address of the second level as the comparison result signal.

* * * * *